United States Patent
Yu et al.

(10) Patent No.: US 8,735,252 B2
(45) Date of Patent: May 27, 2014

(54) METHOD OF SEMICONDUCTOR INTEGRATED CIRCUIT FABRICATION

(75) Inventors: Weibo Yu, Singapore (SG); Ming-Hsi Yeh, Hsinchu (TW); Chih-Tang Peng, Taipei (TW); Hao-Ming Lien, Hsinchu (TW); Chao-Cheng Chen, Shin-Chu (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/490,635

(22) Filed: Jun. 7, 2012

(65) Prior Publication Data

US 2013/0330906 A1 Dec. 12, 2013

(51) Int. Cl.
*H01L 21/336* (2006.01)
(52) U.S. Cl.
USPC .......................................... 438/283; 438/157
(58) Field of Classification Search
USPC ................................... 438/283, 157
See application file for complete search history.

(56) References Cited

U.S. PATENT DOCUMENTS

| | | | |
|---|---|---|---|
| 2008/0014710 A1* | 1/2008 | Bian et al. | 438/424 |
| 2008/0268624 A1* | 10/2008 | Kwak et al. | 438/527 |
| 2009/0061647 A1* | 3/2009 | Mallick et al. | 438/773 |
| 2009/0250769 A1* | 10/2009 | Yu et al. | 257/397 |
| 2010/0078746 A1* | 4/2010 | Jung | 257/432 |
| 2011/0151677 A1* | 6/2011 | Wang et al. | 438/773 |

OTHER PUBLICATIONS

Title: Effect of wet treatment on stablility of spin-on dielectrics for STI gap-filling in nanoscale memory Author: Kim et al Solid state phenonmena vols. 145-146 (2009) pp. 193-196.*
Gyuhyun Kim et al., "Effect of Wet Treatment on Stability of Spin-On Dielectrics for STI Gap-Filling in Nanoscale Memory", Solid State Phenomena vol. 145-146 (2009) pp. 193-197.

* cited by examiner

*Primary Examiner* — Kyoung Lee
*Assistant Examiner* — Ratisha Mehta
(74) *Attorney, Agent, or Firm* — Haynes and Boone, LLP

(57) ABSTRACT

A method of fabricating a semiconductor IC is disclosed. The method includes receiving a device. The device includes a semiconductor substrate, a plurality of fins and trenches between fins in the semiconductor substrate. The method also includes filling the trenches with a dielectric material to form shallow trench isolations (STI), applying a low-thermal-budget annealing to the dielectric material, and applying a wet-treatment to the dielectric material.

15 Claims, 4 Drawing Sheets

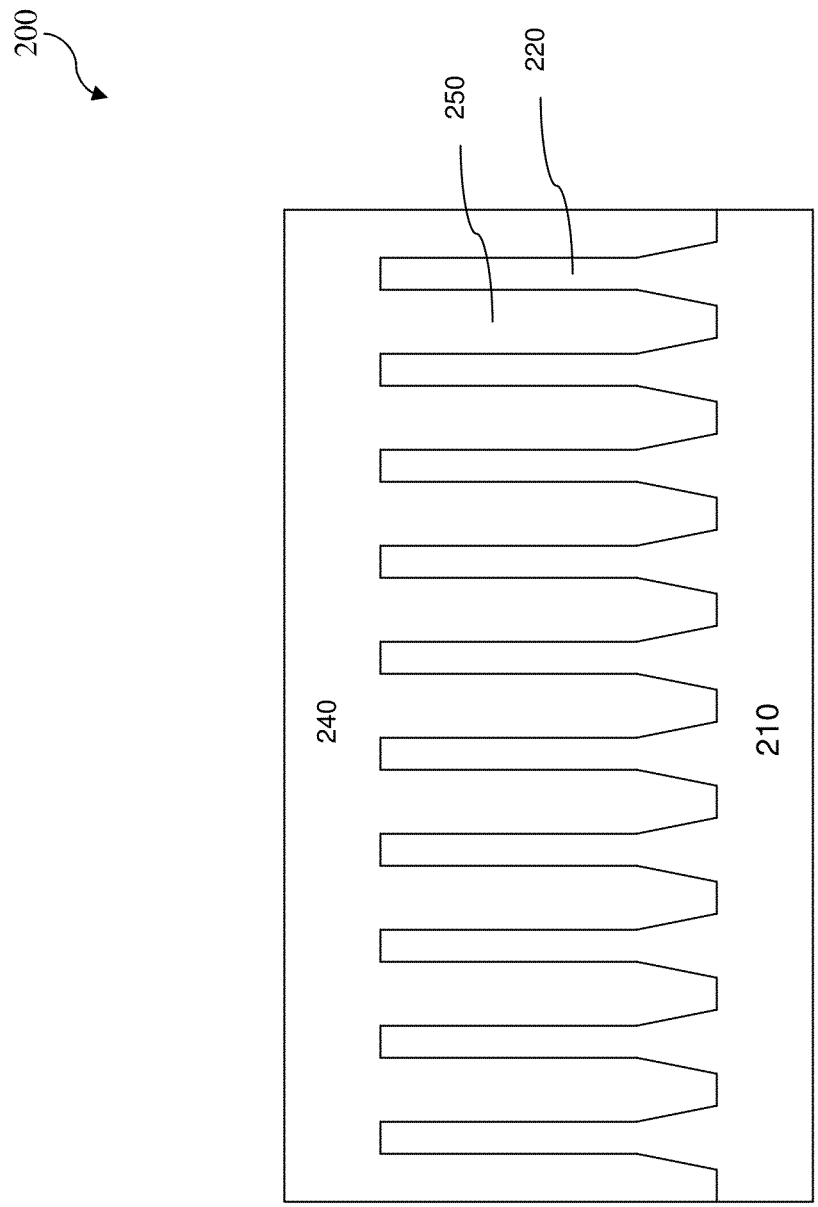

METHOD OF SEMICONDUCTOR INTEGRATED CIRCUIT FABRICATION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. For example when geometry sizes of ICs are getting smaller and smaller, a thermal budget of processes in IC fabrication presents new challenges. As an example, when a high temperature process is used in the formation of dielectric isolation region, deformations of existing fine features may occur. It is desired to have improvements in this area.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2 and 3 are cross-sectional views of an example semiconductor integrated circuit (IC) at fabrication stages constructed according to the method of FIG. 1.

DETAILED DESCRIPTION

Figure 1:
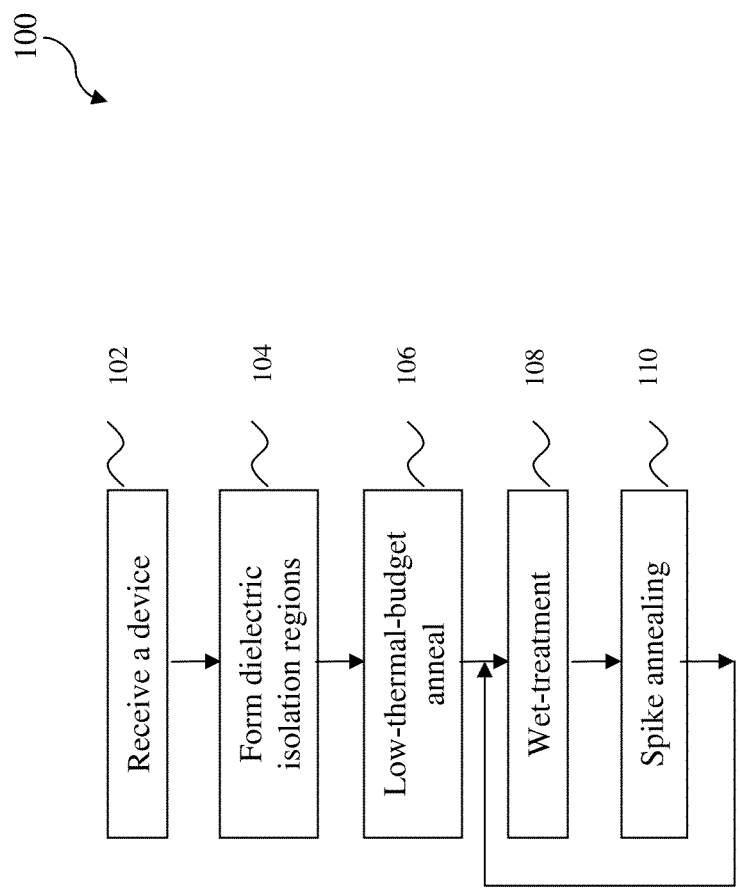
FIG. 1 is a flowchart of an example method for fabricating a semiconductor integrated circuit (IC) constructed according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 2:
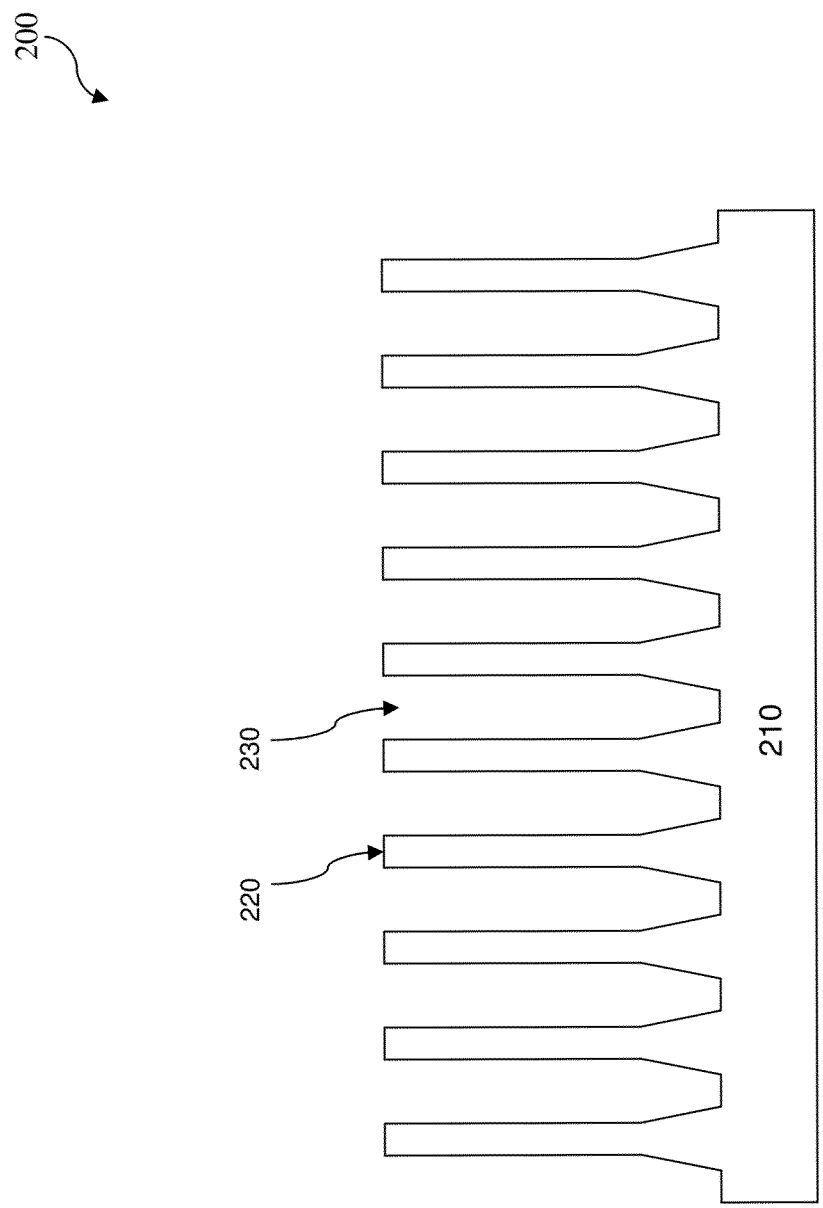

FIG. 1 is a flowchart of one embodiment of a method 100 of fabricating one or more semiconductor devices according to aspects of the present disclosure. The method 100 is discussed in detail below, with reference to a semiconductor device 200 shown in FIGS. 2 and 3 for the sake of example.

The method 100 begins at step 102 by receiving a device. In the present embodiment shown in FIG. 2, the device 200 is a fin-like field-effect transistor (FinFET) device. The FinFET device 200 includes a semiconductor substrate 210. The semiconductor substrate 210 may include silicon, germanium, silicon germanium, gallium arsenide or other appropriate semiconductor materials. Alternatively, the semiconductor substrate 210 may include an epitaxial layer. For example, the semiconductor substrate may have an epitaxial layer overlying a bulk semiconductor. Further, the substrate 210 may be strained for performance enhancement. For example, the epitaxial layer may include a semiconductor material different from those of the bulk semiconductor such as a layer of silicon germanium overlying bulk silicon or a layer of silicon overlying a bulk silicon germanium formed by a process including selective epitaxial growth (SEG). Furthermore, the substrate 210 may include a semiconductor-on-insulator (SOI) structure such as a buried dielectric layer. Also alternatively, the substrate may include a buried dielectric layer such as a buried oxide (BOX) layer, such as that formed by a method referred to as separation by implantation of oxygen (SIMOX) technology, wafer bonding, SEG, or other appropriate method. In fact various embodiments may include any of a variety of substrate structures and material.

The FinFET device 200 also includes a plurality of fins 220 and trenches 230 in the semiconductor substrate 210. Fins 220 and trenches 230 are formed by suitable processes, such as lithography patterning process and etching process. Generally, a lithography patterning process may include photoresist coating (e.g., spin-on coating), photoresist soft baking, mask aligning, photolithography exposing, photo resist post-exposure baking, photoresist developing and rinsing, other suitable processes, or combinations thereof. Alternatively, the photolithography exposing process is implemented or replaced by other proper methods such as maskless photolithography, electron-beam writing, direct-writing, and/or ion-beam writing.

Next, an etching is performed to form fins 220 and trenches 230 in the semiconductor substrate 210 by using the patterned photoresist as an etch mask. The etching may include a dry etch, a wet etch, or a combination of dry etch and wet etch. The dry etching process may implement fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr and/or CHBR3), oxygen-containing gas, iodine-containing gas, other suitable gases and/or plasmas, or combinations thereof. The etching process may include a multiple-step etching to gain etch selectivity, flexibility and desired etch profile.

In one of the broader forms of the present disclosure, the device 200 includes a metal-oxide-semiconductor field-effect transistor (MOSFET). The MOSFET includes a plurality of isolation trenches in the semiconductor substrate 210 to electronically isolate active regions. In downstream processes, dielectric isolations are formed by filling isolation trenches with the dielectric material 240.

In another one of the broader forms of the present disclosure, the device 200 includes another MOSFET having gaps between gate structures in the semiconductor substrate 210. In downstream processes, these gaps are filled by the dielectric material 240 to form a pre metal dielectric (PMD) layer.

In another one of the broader forms of the present disclosure, the device 200 includes another MOSFET having gaps between interconnection features in the semiconductor substrate 210. In downstream processes, these gaps are filled by the dielectric material 240 to form an inter-metal dielectric (IMD) layer.

In another one of the broader forms of the present disclosure, the device 200 includes gaps between regions. In downstream processes, these gaps are filled by the dielectric material 240 to form dielectric isolations or an isolation layer.

Referring to FIGS. 1 and 3, the method 100 proceeds to step 104 by performing a gap filling process to fill in the trenches 230 and form shallow trench isolations (STI) 250 in the semiconductor substrate 210 of the device 200. The trenches 230 (FIG. 2) are filled with a dielectric material 240. As a semiconductor device is scaled down to advanced technology notes such as 20 nm and beyond, the aspect ratio (the ratio of depth to width) of the trenches increase. A gap filling material with properties of excellent gap-filling and self-planarization is desired. In the present embodiment, the dielectric material 240 includes silicon oxide, fluorinated silica glass (FSG), carbon doped silicon oxide, amorphous fluorinated carbon and carbon-free silica glass. The dielectric material 240 may also include one or more materials such as spin-on dielectric (SOD) materials based on such as perhydropolysilazane (PHPS), silsesquioxane and polysilazane, or any proper dielectric materials. The dielectric material 240 is deposited by suitable techniques, such as chemical vapor deposition (CVD), spin-on coating, flowable CVD (FCVD) and conformal film deposition (CFD).

The method 100 proceeds to step 106 by applying a low-thermal-budget anneal to the dielectric material 240. The annealing process enhances quality of the dielectric material 240 through a mechanism of solvent out-diffusion and cross-linking. The annealing process includes a long range pre-heat to minimize or even eliminate end of range (EOR) defects. The annealing process may be conducted in an oxidizing ambient, a combination of steam ambient and oxygen ambient, or under an inert gas atmosphere in a furnace.

Figures 4A, 4B:
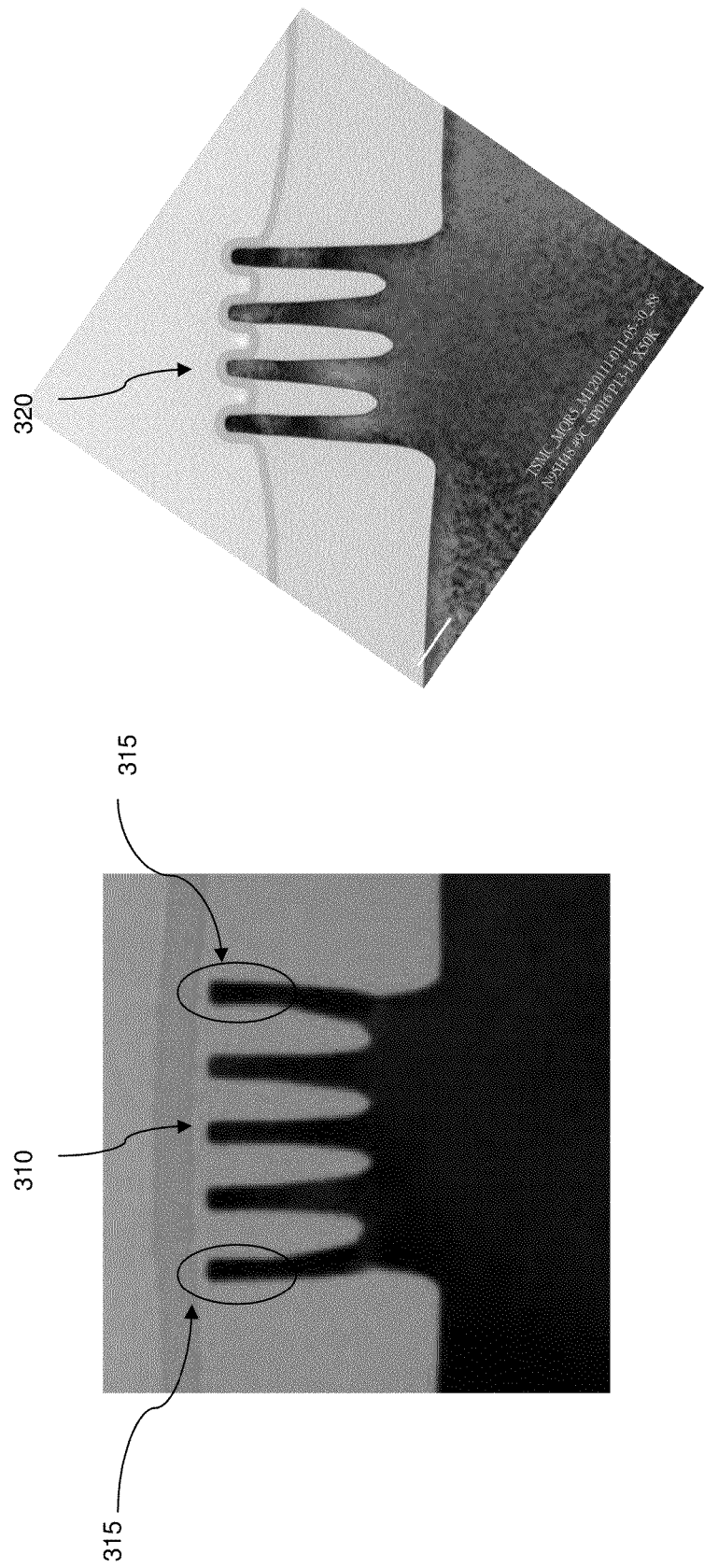
FIG. 4a is a cross-sectional image of a fin-like field-effect transistor (FinFET) at a fabrication stage after receiving a high thermal budget process.
FIG. 4b is a cross-sectional image of a FinFET at a fabrication stage constructed according to the method of FIG. 1.

Referring to FIGS. 4a and 4b, as semiconductor ICs are scaled down to advanced technology nodes such as 20 nm and beyond, fine structures, as well as behaviors and performances, of the ICs have become more and more sensitive to thermal budget of thermal processes in both front end of line and back end of line. For example, deformations 315 of fin structures 310 are observed after a high thermal budget annealing with a temperature higher than 1000° C. and duration more than 1 hour, as shown in FIG. 4a. In the present embodiment, a low-thermal-budget annealing process is conducted with a temperature in the range from about 200° C. to about 800° C. and an annealing duration in the range from abut 10 minutes to about 3 hours. The low-thermal-budget dielectric isolation formation reduced deformation of fine features, such as fin structures 320, as shown in FIG. 4b.

In some embodiments, the method 100 further includes applying a chemical mechanical polishing (CMP) process to remove excessive dielectric material 240 and planarize the top surface of the dielectric material 240.

The method 100 proceeds to step 108 by applying a wet-treatment to the dielectric material 240 in the device 200. The wet-treatment may be performed in a wet station or in a chamber. The wet-treatment may be performed in a batch mode or in a single wafer mode.

The wet-treatment includes one or more wet processes with various solutions, such as hot deionized (HDI) water with a temperature in the range from about 50° C. to about 100° C. and a duration in the range from about 5 minutes to about one hour, a sulfuric acid-hydrogen peroxide mixture (SPM) with a temperature in the range from about 80° C. to about 250° C. and a duration in the range from about one minute to about 30 minutes, a $H_2O$ steam with a temperature in the range from about 100° C. to about 150° C. and a duration in the range from about 5 minutes to about one hour, a $H_2O_2$ with a temperature in the range from about 50° C. to about 90° C. with a duration in the range from about 5 minutes to about one hour, or any other suitable wet process or a combination thereof. It is believed that the wet-treatment enhances the quality of the dielectric material 240 by driving-in $H_2O$ into the dielectric material 240 and converting a portion of Si—N, Si—H and H—N bonds to a Si—O bond in the dielectric material 240.

The dielectric material 240 may be softer, less dense, and more porous than a densified oxide, such as a thermal oxide or a high-density-plasma (HDP) oxide. By receiving the low-thermal-budget annealing and the wet-treatment, an improvement of the quality of the dielectric material 240 is observed. In order to characterize the dielectric material 240, such as density, refractive index and composition, at various stages of processes, a metrology of characterization is conducted by using suitable techniques, such as Fourier Transform Infrared (FTIR) spectroscopy, electron energy loss spectroscopy in scanning tunneling electron microscope (EELS-STEM), ultrasonic force microscopy (UFM), x-ray photoelectron spectroscopy (XPS), electron spin resonance spectroscopy (ESR), current-voltage plots and wet etch rate (WER) in a dilute HF solution.

The characterization may serve as an indicator, or indicators, of how close the dielectric material 240 is to becoming a densified oxide. According to requirements of the device 200 performance, target of properties of the dielectric material 240 may be predetermined. Properties of the dielectric material 240 may be evaluated at various stages of fabrication. For example, a WER in a dilute HF solution may be used as an indicator of the density of the dielectric material 240 in various stages of processes. It has been observed that after receiving the low-thermal-budget annealing and the wet-treatment, the WER of the dielectric material 240 is reduced dramatically and much closer to those of a densified oxide. With a lower WER, a STI divot control is enhanced.

The method 100 proceeds to step 110 by applying a spike annealing to the dielectric material 240 in the device 200. The spike annealing process having a very short time duration is applied to the dielectric material 240 in the device 200 to enhance the effect of the wet-treatment. The spike annealing may be a rapid thermal anneal (RTA), a laser anneal, and/or a flash lamp anneal. In the present embodiment, the spike annealing process is performed with a temperature in the range from about 150° C. to about 400° C. and with a duration in the range from about one second to about 10 minutes.

In yet another embodiment, the wet-treatment and the spike annealing process are repeated more to meet a predetermined target of properties of the dielectric material 240 in the device 200.

In yet another embodiment, the low-thermal-budget annealing process is repeated after the last wet-treatment or the last spike annealing process to further enhance the quality of the dielectric material 240 in the device 200.

The method 100 may further include forming source/drains and gate stacks in the semiconductor substrate 210 by proper techniques, such as deposition, photolithography patterning, etching and ion implanting. The method 100 may also include forming multilayer interconnections. The multilayer interconnections may include vertical interconnects, such as conventional vias or contacts, and horizontal interconnects, such as metal lines. The various interconnection features may implement various conductive materials including copper, tungsten and silicide. For the sake of simplicity, these additional processes are not described herein.

Although embodiments of the present disclosure have been described in detail, those skilled in the art should understand that they may make various changes, substitutions and alterations herein without departing from the spirit and scope of the present disclosure.

Based on the above, it can be seen that the present disclosure offers a method of forming a dielectric isolation or a layer with a low thermal budget process for advanced technology notes. The method offers a flexible post gap filling treatment scheme to meet various quality targets of the dielectric material in the dielectric isolation or the layer.

The present disclosure provides many different embodiments of fabricating a semiconductor IC that provide one or more improvements over the prior art. In one embodiment, a method for fabricating a fin-like field-effect transistor (FinFET) includes receiving a FinFET device. The FinFET device includes a semiconductor substrate, a plurality of fins and trenches in the semiconductor substrate. The method also includes filling said trenches with a dielectric material to form shallow trench isolations (STI), applying a low-thermal-budget annealing to the dielectric material and applying a wet-treatment to the dielectric material.

In another embodiment, a method for fabricating a semiconductor IC includes receiving a device. The device includes a semiconductor substrate and a plurality of isolation trenches in the semiconductor substrate. The method also includes filling said isolation trenches with a dielectric material, applying a low-thermal-budget annealing to the dielectric material and applying a wet-treatment to the dielectric material.

In yet another embodiment, a method for fabricating a semiconductor IC includes receiving a device. The device includes a semiconductor substrate, a plurality of gate stacks and gaps between gate stacks in the semiconductor substrate. The method also includes filling said gaps with a dielectric material, applying a low-thermal-budget annealing to the dielectric material; wherein the low-thermal-budget annealing is performed with a temperature in the range from about 200° C. to about 800° C. and with a duration in the range from about 10 minutes to about 3 hours and applying a wet-treatment to the dielectric material, wherein the wet-treatment includes one or more from the group consisting of hot deionized (HDI) water treatment, sulfuric acid-hydrogen peroxide mixture (SPM), $H_2O$ steam treatment and $H_2O_2$ treatment.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for fabricating a semiconductor integrated circuit (IC), the method comprising:
    receiving a fin-like field-effect transistor (FinFET) device, the FinFET device including:
        a semiconductor substrate,
        a plurality of fins in the semiconductor substrate, and
        a plurality of trenches between fins in the semiconductor substrate;
    filling the trenches with a dielectric material to form shallow trench isolation (STI) features;
    applying a low-thermal-budget annealing to the dielectric material; and
    after applying the low-thermal budget annealing to the dielectric material, applying a wet-treatment to the dielectric material.

2. The method of claim 1, wherein the low-thermal-budget annealing is performed with a temperature in a range from about 200° C. to about 800° C. and with a duration in a range from about 10 minutes to about 3 hours.

3. The method of claim 1, wherein the wet-treatment includes a hot deionized (HDI) water treatment with a temperature in a range from about 50° C. to about 100° C. and with a duration in a range from about 5 minutes to about 1 hour.

4. The method of claim 1, wherein the wet-treatment includes a sulfuric acid-hydrogen peroxide mixture (SPM) with a temperature in a range from about 80° C. to about 250° C. and a duration in a range from about one minute to about 30 minutes.

5. The method of claim 1, wherein the wet-treatment includes a $H_2O$ steam treatment with a temperature in a range from about 100° C. to about 150° C. and a duration in a range from about 5 minutes to about one hour.

6. The method of claim 1, wherein the wet-treatment includes a $H_2O_2$ treatment with a temperature in a range from about 50° C. to about 90° C. with a duration in the range from about 5 minutes to about one hour.

7. The method of claim 1, wherein the wet-treatment includes one or more from the group consisting of HDI, SPM, $H_2O$ steam, and $H_2O_2$.

8. The method of claim 1, further comprising:
    applying a spike annealing to the dielectric material after applying the wet-treatment, wherein the spike annealing is performed with a temperature in a range from about 150° C. to about 400° C. and with a duration in a range from about one second to about 10 minutes.

9. The method of claim 8, further comprising:
    repeating the wet-treatment and the spike annealing to the dielectric material.

10. The method of claim 1, wherein the dielectric material includes one or more materials from the group consisting of perhydropolysilazane (PHPS) based, silsesquioxane based, and polysilazane based.

11. A method for fabricating a semiconductor integrated circuit (IC), the method comprising:
    receiving a device, the device including a semiconductor substrate and an isolation trench in the semiconductor substrate;
    filling the isolation trench with a dielectric material;
    applying a low-thermal-budget annealing to the dielectric material;
    after applying the low-thermal budget annealing to the dielectric material, applying a wet-treatment to the dielectric material; and
    after the wet-treatment to the dielectric material, applying a spike annealing to the dielectric material.

12. The method of claim 11, wherein the low-thermal-budget annealing is performed with a temperature in a range from about 200° C. to about 800° C. and with a duration in a range from about 10 minutes to about 3 hours.

13. The method of claim 11, wherein the wet-treatment includes one or more processes from a group consisting of:
    a hot deionized (HDI) water treatment with a temperature in a range from about 50° C. to about 100° C. and with a duration in a range from about 5 minutes to about 1 hour;

a sulfuric acid-hydrogen peroxide mixture (SPM) with a temperature in a range from about 80° C. and about 250° C. and a duration in a range from about one minute to about 30 minutes;

a $H_2O$ steam treatment with a temperature in a range from about 100° C. to about 150° C. and a duration in a range from about 5 minutes to about one hour;

a $H_2O_2$ treatment with a temperature in a range from about 50° C. to about 90° C. with a duration in a range from about 5 minutes to about one hour.

14. The method of claim 11, wherein the spike annealing is performed with a temperature in a range from about 150° C. to about 400° C. and with a duration in a range from about one second to about 10 minutes.

15. A method for fabricating a semiconductor integrated circuit (IC), the method comprising:

receiving a device, the device including a semiconductor substrate, a plurality of gate stacks over the semiconductor substrate, and a plurality of gaps in the semiconductor substrate between the gate stacks;

filling the gaps with a dielectric material;

applying a low-thermal-budget annealing to the dielectric material, wherein the low-thermal-budget annealing is performed with a temperature in a range from about 200° C. to about 800° C. and with a duration in a range from about 10 minutes to about 3 hours;

after applying the low-thermal budget annealing to the dielectric material, applying a wet-treatment to the dielectric material, wherein the wet-treatment includes one or more from the group consisting of hot deionized (HDI) water treatment, sulfuric acid-hydrogen peroxide mixture (SPM), $H_2O$ steam treatment, and $H_2O_2$ treatment;

after applying the wet-treatment, applying a spike annealing; and repeating the wet-treatment and the spike annealing to the dielectric material.

* * * * *